(12) United States Patent
Yagii et al.

(10) Patent No.: US 6,194,906 B1
(45) Date of Patent: Feb. 27, 2001

(54) INSPECTION ADAPTER BOARD FOR PRINTED BOARD, METHOD FOR INSPECTING PRINTED BOARD, AND METHOD AND APPARATUS FOR PRODUCING INFORMATION FOR FABRICATING THE INSPECTION ADAPTER BOARD

(75) Inventors: Keikichi Yagii, Tama; Yuichi Haruta, Hanno, both of (JP)

(73) Assignee: JSR Corporation, Tokyo (JP)

(\*) Notice: Subject to any disclaimer, the term of this patent is extended or adjusted under 35 U.S.C. 154(b) by 0 days.

(21) Appl. No.: 09/333,668

(22) Filed: Jun. 16, 1999

(30) Foreign Application Priority Data

Jun. 23, 1998 (JP) .................................................. 10-176172

(51) Int. Cl.$^7$ .......................... G01R 31/02; G01R 13/42; G01R 15/00
(52) U.S. Cl. .......................... 324/758; 324/761; 324/754; 703/25; 716/4; 716/5; 716/15
(58) Field of Search ..................................... 324/761, 754, 324/758, 759, 538, 541; 716/4, 5, 15; 703/25; 702/81–84

Primary Examiner—Safet Metjahic
Assistant Examiner—Anjan K Deb
(74) Attorney, Agent, or Firm—Oblon, Spivak, McClelland, Maier & Neustadt, P.C.

(57) ABSTRACT

The invention provides an inspection adapter board for printed board, which has inspection electrodes of a pitch wider than electrodes to be inspected, permits carrying out the necessary inspection for a printed board by a tester having a small capacity, and can be designed and fabricated with ease, and a method for inspecting the printed board by an inspection adapter board. The invention also provides a method and apparatus for producing information for fabricating such an inspection adapter board. The inspection adapter board is equipped with inspection electrodes corresponding to the electrodes to be inspected. At least one of the inspection electrodes is a common inspection electrode commonly corresponding to two or more electrodes to be inspected. The common inspection electrode is formed in a state that wiring networks do not form a closed circuit. Alternatively, at least one of the inspection electrodes is formed as a representative inspection electrode corresponding to one electrode to be inspected in each wiring network.

13 Claims, 4 Drawing Sheets

INSPECTION ADAPTER BOARD FOR PRINTED BOARD, METHOD FOR INSPECTING PRINTED BOARD, AND METHOD AND APPARATUS FOR PRODUCING INFORMATION FOR FABRICATING THE INSPECTION ADAPTER BOARD

BACKGROUND OF THE INVENTION

1. Field of the Invention

The present invention relates to an inspection adapter board having a function capable of electrically connecting a printed board as the subject of inspection to a tester for inspecting the electric performance of the printed board, an inspection method of the printed board, and a method and apparatus for producing information for fabricating the inspection adapter board.

2. Description of the Background Art

A printed wiring board (hereinafter referred to as "printed board" merely) has a function as a substrate for supporting active elements and passive elements such as integrated circuits (ICs), large scale integrated circuits (LSIs), transistors and resistors and moreover a wiring function for achieving the necessary electrical connection among electrodes related to these elements. More specifically, in the printed board, the specific arrangement of individual electrodes is determined according to the arranged state and connected conditions of elements to be supported on the printed board, and a number of electrical networks are formed by creating the electrically connected state or insulated state among these electrodes.

In general, inspection as to electrical performance of a printed board includes two of electrical conduction checking inspection (hereinafter referred to as "conduction inspection" merely) for inspecting whether no breaking of wire occurs in a wiring network in which plural electrodes on the printed board are to be electrically connected to each other, or not, and insulation checking inspection (hereinafter referred to as "insulation inspection" merely) for inspecting whether no insulation failure occurs between any two of wiring networks independently formed on the printed board, or not. The term "wiring network" as used herein means a circuit composed of a set of electrodes, 2 or more in number, electrically connected to each other, which are formed on a printed board, and printed wirings for connecting the respective electrodes to each other, including electroconductive parts for interlayer connection such as plated through holes and vias. This circuit is generally an open circuit, but may be a closed circuit or a combination thereof in some cases.

Methods for carrying out these inspections include individually inspecting methods such as a flying probe method in which inspection probes are brought into individual contact with each of a pair of electrodes to be inspected to measure an electrical resistance between both electrodes, and besides collectively inspecting methods such as a method in which pin-like probes arranged at positions corresponding to many electrodes to be inspected are collectively brought into contact with all the electrodes to be inspected, and a method making use of an inspection adapter board composed of a printed board in which inspection electrodes each having a shape and size suitable to and at positions of corresponding to electrodes to be inspected are arranged as probes in place of the pin-like probes.

In recent years, the wiring density in a printed board has been rapidly heightened, thus leading to the shortening of a distance or pitch between wirings and moreover the miniaturization of the electrodes themselves and the heightening of the arrangement density thereof. As a result, even an inspection probe unit has been naturally required to make it possible to certainly carry out the expected inspection of a printed board to be inspected, on which extremely minute electrodes to be inspected are arranged in close vicinity to one another.

The above individually inspecting methods can meet this requirement with comparative ease. However, the inspection operation must be conducted by bringing the probes into individual contact with all of many pairs of electrodes to be inspected, so that it takes a very long time to conduct the necessary inspection, which is hence unfit for actual use.

With respect to the collectively inspecting methods on the other hand, in either case where the pin-like probes are used or where the inspection adapter board having the inspection electrodes is used, a great number of minute pin probes or inspection electrodes must be arranged in a limited narrow region with high positional accuracy in an inspection probe unit. Extremely high techniques are required to realize this arrangement, so that the fabrication of such an inspection probe unit actually requires a great deal of cost and time to an impracticable extent.

In the inspection of a print board having minute and high-density wiring patterns, it is actually impossible to carry out the intended inspection if even slight misregistration occurs between a printed board as the subject of inspection and the inspection adapter board brought into contact with the printed board, so that the result of the inspection becomes unreliable. Therefore, a technique for accurately aligning them with each other has also come to be required of such inspection at the same time.

As described above, in the field of current probe units for the inspection of printed boards, there is demand for development of a specific method for arranging minute pin-like probes or inspection electrodes at high density and with high positional accuracy in response to the density heightening and miniaturization of wiring patterns in the printed board, and a study is made along this line under the circumstances.

Figure 1:
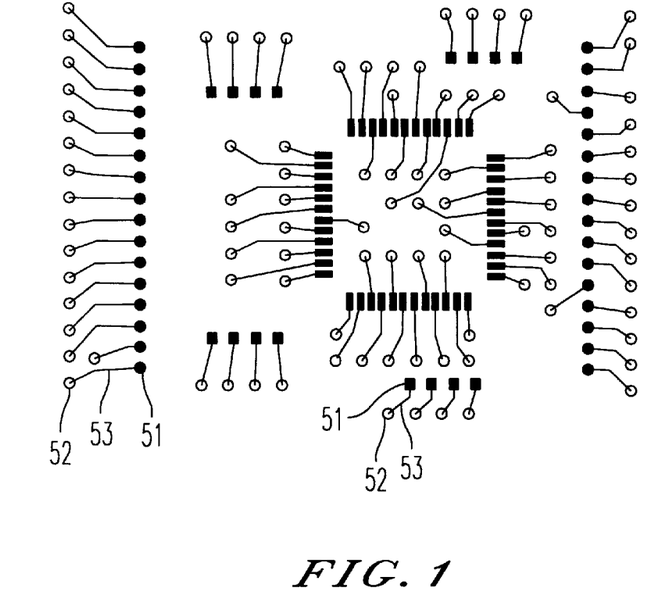
FIG. 1 illustrates inspection electrodes and terminal electrodes in an exemplary conventional inspection adapter board in a state laid to overlap each other.

A specific description is given with reference to FIG. 1 illustrating inspection electrodes provided on one side of an exemplary conventional inspection adapter board, which is used as an inspection probe in the method for collectively inspecting a printed board to be inspected (hereinafter may also be referred to as "board to be inspected"), and terminal electrodes provided on the other side thereof in a state laid to overlap each other or in a through-viewed state.

Inspection electrodes 51, 51 indicated by black rectangles or circles are arranged on one side of this inspection adapter board, to which the board to be inspected is opposed, and terminal electrodes 52, 52 illustrated by white circles are arranged on lattice points at regular intervals on the other side to form grids. Further, corresponding inspection electrodes 51 and terminal electrodes 52 are electrically connected to each other by a printed wiring 53 to form respective pairs.

Each of the inspection electrodes 51 conforms, in shape, size and position, with its corresponding one of many electrodes to be inspected on the board to be inspected.

Such an inspection adapter board is installed in an inspection apparatus for printed board and used to inspect the electrical performance of the board to be inspected.

Figure 2:
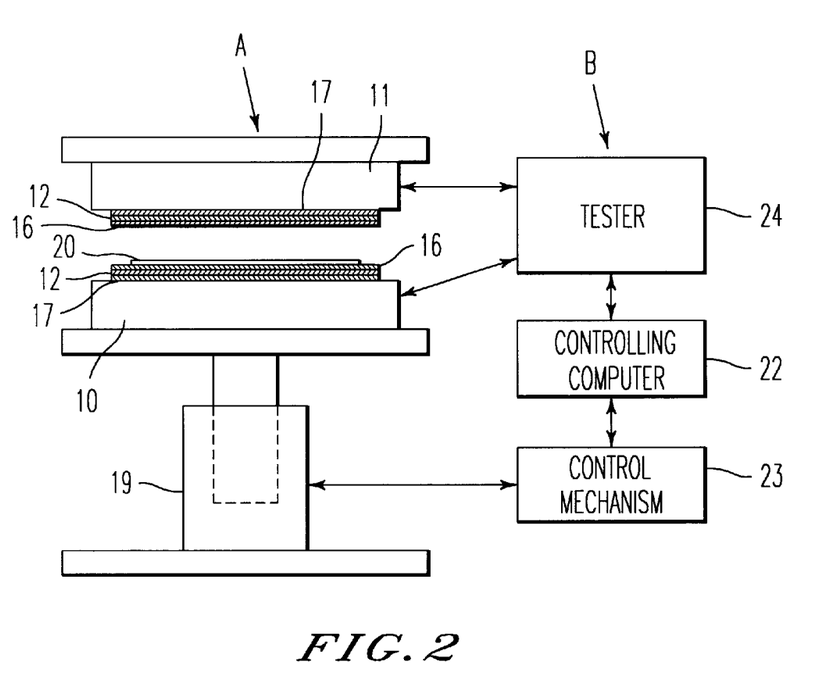
FIG. 2 schematically illustrates the construction of an inspection apparatus for printed board.

FIG. 2 illustrates an example of the inspection apparatus for printed board, and reference symbols A and B indicate an inspecting head mechanism and an inspection control mechanism, respectively.

In the inspecting head mechanism A, reference numeral 10 indicates a lower head. An inspection adapter board 12 is installed on the lower head 10, and a board 20 to be inspected is arranged on the inspection adapter board 12. More specifically, the adapter board 12, on the both sides of which connector sheets 16 and 17 composed of, for example, anisotropically electroconductive rubber sheets or the like have been separately arranged, is installed in the lower head 10, and the board 20 to be inspected is arranged thereon. In an upper head 11 over the lower head 10, an inspection adapter board 12 and connector sheets 16 and 17 are installed in a state stacked in the same manner as described above.

Reference numeral 19 indicates a drive mechanism which is driven by a control mechanism 23 controlled by a controlling computer 22 in the inspection control mechanism B, whereby the lower head 10 is pressed against the upper head 11, and so each of the inspection adapter boards 12, 12 is brought into contact under pressure with the board 20 to be inspected to achieve the electrical connection between them through the connector sheets 16, 17. At this time, the conditions of electrodes to be inspected on the board 20 to be inspected as to whether the electrodes are electrically conducted or not are sent to a tester 24 through the lower head 10 and the upper head 11, thereby carrying out the inspection.

In order to carry out the necessary inspection for the board 20 to be inspected by such an inspection apparatus, it is essential to achieve a state that the positions of the electrodes to be inspected on the board 20 accurately have conformed with the positions of their corresponding inspection electrodes on the inspection adapter board 12. In order to achieve this state, any one or more of various kinds of alignment mechanisms are generally incorporated into the inspection apparatus.

However, in the existing circumstances that electrodes on a printed board have been miniaturized and heightened in density in recent years, it has been extremely difficult to accurately align the board 20 to be inspected with the inspection adapter board 12.

In the conventional inspection adapter boards, it is necessary to provide inspection electrodes in the same number and arrangement as many electrodes to be inspected on the board to be inspected in individually correspondingly to the electrodes to be inspected. Correspondingly to this, a tester is also required to have a great inspection capacity.

With the miniaturization and the heightening of arrangement density of electrodes on a printed board to be inspected, the electrical connection between the inspection electrodes and the terminal electrodes (grids) in the inspection adapter board by wirings also comes to present extreme difficulty at present. Recently, it has been impossible to form the necessary wirings within a board unless a multilayer interconnection structure, in which one or more interlayer wirings are formed, is provided, though a sufficient wiring region has heretofore been provided by both sides alone of a board.

Printed boards practically used are generally fabricated on the premise that the same kind of boards are produced in a quantity of at least certain numbers, so that their design and fabrication may be allowed to take time and cost in their own way. However, the inspection adapter board is basically fabricated as a sole product and is hence required to produce it in the production time as short as possible and at a cost as little as possible. Accordingly, the use of the multilayer interconnection structure in the inspection adapter board correspondingly to the miniaturization and density heightening of electrodes on the board to be inspected imposes a heavy burden on the fabrication of the inspection adapter board.

SUMMARY OF THE INVENTION

The present invention has been made on the basis of the foregoing circumstances and has as its general object the provision of an inspection adapter board for printed board, which has inspection electrodes of a large size formed at a pitch wider than the minimum pitch between minute electrodes to be inspected arranged in high-density on a printed board to be inspected, hence permits carrying out the necessary inspection for the printed board even by a board inspecting apparatus or tester, which has a small capacity, and can be designed and fabricated with ease, the provision of a method for inspecting a printed board using such an inspection adapter board, and the provision of a method and apparatus for producing information for fabricating the inspection adapter board.

More specifically, a first object of the present invention is to provide a first inspection adapter board having common inspection electrodes and adapted to inspect the electrical conduction state of a board to be inspected.

A second object of the present invention is to provide a second inspection adapter board having representative inspection electrodes and adapted to inspect the insulation state of a board to be inspected.

A third object of the present invention is to provide a method for inspecting a board to be inspected using the first inspection adapter board for inspecting the electrical conduction state and the second inspection adapter board for inspecting the insulation state.

A fourth object of the present invention is to provide a method and apparatus for producing information for fabricating an inspection adapter board for conduction inspection, by which information as to common inspection electrodes can be produced with extreme ease correspondingly to an actual board to be inspected.

A fifth object of the present invention is to provide a method and apparatus for producing information for fabricating an inspection adapter board for insulation inspection, by which information as to representative inspection electrodes and information as to monitoring inspection electrodes can be produced with extreme ease correspondingly to an actual board to be inspected.

A sixth object of the present invention is to provide a method and apparatus for producing information for fabricating both first and second inspection adapter boards.

The above objects can be achieved by the present invention described below.

According to the present invention, there is thus provided an inspection adapter board for printed board, which is equipped with inspection electrodes at positions corresponding to the positions of plural electrodes to be inspected on a printed board to be inspected, and is used for the conduction inspection of the printed board, wherein:

at least one of the inspection electrodes is a common inspection electrode having a shape corresponding to a group of electrodes to be inspected, which is composed of at least two electrodes to be inspected, and the common inspection electrode is formed in a state that wiring networks formed independently from each other on the printed board to be inspected do not form an electrically closed circuit with each other through the common inspection electrode when the common inspection electrode is brought into contact with the printed board for the purpose of inspection.

In this inspection adapter board, a plurality of the inspection electrodes may be electrically connected to each other by wirings.

According to the present invention, there is also provided an inspection adapter board for printed board, which is equipped with inspection electrodes, and is used for the insulation inspection of a printed board to be inspected, wherein at least one of the inspection electrodes is formed as a representative inspection electrode which is to be electrically connected to only one electrode to be inspected belonging to each of wiring networks to be inspected formed independently from each other on the printed board to be inspected at a position corresponding to said one electrode to be inspected.

In this inspection adapter board, a monitoring inspection electrode electrically connected to the representative inspection electrode may preferably be formed.

According to the present invention, there is further provided a method for inspecting a printed board, which comprises using the above-described inspection adapter boards to carry out conduction inspection as to each of wiring networks formed on the printed board and moreover insulation inspection between the wiring networks.

According to the present invention, there is still further provided a method for inspecting printed boards, which comprises providing an inspection adapter board for carrying out conduction inspection as to each of wiring networks formed on a printed board to be inspected and an inspection adapter board for carrying out insulation inspection between the wiring networks side by side, and placing printed boards to be inspected respectively on these adapter boards for conduction inspection and for insulation inspection to carry out conduction inspection for one printed board and insulation inspection for the other printed board at the same time.

As the adapter boards for conduction inspection and for insulation inspection, there may be used the first-described inspection adapter board and the second-described inspection adapter board, respectively.

According to such inspection adapter boards as described above, printed boards having electrodes miniaturized and heightened in density can be subjected to the necessary conduction inspection and insulation inspection though the adapter boards have inspection electrodes smaller than the number of electrodes to be inspected and extremely high in flexibility of size and arrangement density. Accordingly, in each inspection, a small capacity suffices for a tester.

In addition, necessary inspections for a board to be inspected can be achieved with certainty by carrying out both conduction inspection and insulation inspection, and moreover simple inspection adapter boards suffice for both inspections. Therefore, the design and fabrication thereof become easy, and a small capacity suffices for a tester. Further, the necessary inspections for a great number of printed boards can be carried out with extremely high efficiency by utilizing the above-described inspection adapter boards.

According to the present invention, there is yet still further provided a method for producing information for fabricating an inspection adapter board for printed board, which adapter board is equipped with inspection electrodes at positions corresponding to the positions of plural electrodes to be inspected on a printed board to be inspected, wherein at least one of the inspection electrodes is a common inspection electrode having a shape corresponding to a group of electrodes to be inspected, which is composed of at least two electrodes to be inspected, and the common inspection electrode is formed in a state that wiring networks formed independently from each other on the printed board to be inspected do not form an electrically closed circuit with each other through the common inspection electrode when the common inspection electrode is brought into contact with the printed board for the purpose of inspection, the method comprising producing information as to the common inspection electrode by executing:

(1) a grouping processing in which geometric information as to all the electrodes to be inspected on the printed board to be inspected and information as to electrical connection between the electrodes are utilized to form at least one group composed of plural electrodes to be inspected; and (2) a common electrode forming processing in which a virtual common electrode corresponding to a state that all the electrodes to be inspected belonging to one group of the electrodes to be inspected have been electrically connected to each other is formed.

According to the present invention, there is yet still further provided an apparatus for producing information, which is an information processor used in fabricating an inspection adapter board for printed board, which adapter board is equipped with inspection electrodes at positions corresponding to the positions of plural electrodes to be inspected on a printed board to be inspected, wherein at least one of the inspection electrodes is a common inspection electrode having a shape corresponding to a group of electrodes to be inspected, which is composed of at least two electrodes to be inspected, and the common inspection electrode is formed in a state that wiring networks formed independently from each other on the printed board to be inspected do not form an electrically closed circuit with each other through the common inspection electrode when the common inspection electrode is brought into contact with the printed board for the purpose of inspection, the apparatus having:

(1) a grouping processing function by which geometric information as to all the electrodes to be inspected on the printed board to be inspected and information as to electrical connection between the electrodes are utilized to form at least one group composed of plural electrodes to be inspected; and (2) a processing function of forming a common electrode, by which a virtual common electrode corresponding to a state that all the electrodes to be inspected belonging to one group of the electrodes to be inspected have been electrically connected to each other is formed, wherein information as to the common inspection electrode is produced.

According to the present invention, there is yet still further provided a method for producing information for fabricating an inspection adapter board for printed board, which adapter board is equipped with inspection electrodes, wherein at least one of the inspection electrodes is formed as a representative inspection electrode which is to be electrically connected to a representative electrode to be inspected composed of only one electrode to be inspected belonging to each of wiring networks formed independently from each other on the printed board to be inspected at a position corresponding to said representative electrode to be inspected, the method comprising producing information as to the representative inspection electrode and information as to a monitoring inspection electrode by executing:

(1) a processing for selecting a representative electrode to be inspected, in which only one electrode among plural electrodes to be inspected belonging to each of the wiring networks formed independently on the printed board to be inspected is selected as the representative electrode to be inspected; and (2) a processing for selecting a monitoring electrode to be inspected, in which at least one electrode to be inspected is selected as the monitoring electrode to be inspected from other electrodes to be inspected than the representative electrode to be inspected, which are electrically connected to the representative electrode to be inspected, among electrodes to be inspected formed on the printed board to be inspected.

According to the present invention, there is yet still further provided an apparatus for producing information, which is an information processor used in fabricating an inspection adapter board for printed board, which adapter board is equipped with inspection electrodes, wherein at least one of the inspection electrodes is formed as a representative inspection electrode which is to be electrically connected to a representative electrode to be inspected composed of only one electrode to be inspected belonging to each of wiring networks formed independently from each other on the printed board to be inspected at a position corresponding to said representative electrode to be inspected, the apparatus having:

(1) a processing function of selecting a representative electrode to be inspected, by which only one electrode among plural electrodes to be inspected belonging to each of the wiring networks formed independently on the printed board to be inspected is selected as the representative electrode to be inspected; and (2) a processing function of selecting a monitoring electrode to be inspected, by which at least one electrode to be inspected is selected as the monitoring electrode to be inspected from other electrodes to be inspected than the representative electrode to be inspected, which are electrically connected to the representative electrode to be inspected, among electrodes to be inspected formed on the printed board to be inspected, wherein information as to the representative inspection electrode and information as to a monitoring inspection electrode are produced.

According to the present invention, there is yet still further provided a method for producing information used in fabricating an inspection adapter board for printed board, the method comprising executing the above-described grouping processing and common electrode forming processing, and executing the above-described processing for selecting a representative electrode to be inspected and processing for selecting a monitoring electrode to be inspected.

According to the present invention, there is yet still further provided an apparatus for producing information used in fabricating an inspection adapter board for printed board, the apparatus having the above-described grouping processing function and processing function of forming a common electrode, and the above-described processing function of selecting a representative electrode to be inspected and processing function of selecting a monitoring electrode to be inspected.

According to the present invention, in the case where the first-described inspection adapter board and the second-described inspection adapter board are fabricated, plural processing means and setting conditions are provided in order to produce information as to common inspection electrodes, representative inspection electrodes and monitoring inspection electrodes corresponding to electrodes to be inspected on a board to be inspected by processing information as to the electrodes to be inspected, and these means and conditions are optionally changed for use, whereby the information can be processed on many kinds of boards to be inspected in such a manner that the optimum results can be obtained according to the respective purposes. Accordingly, the intended inspection adapter boards can be provided with extreme ease.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE PREFERRED EMBODIMENTS

The inspection adapter boards according to the present invention will hereinafter be described in detail.

Figure 3:
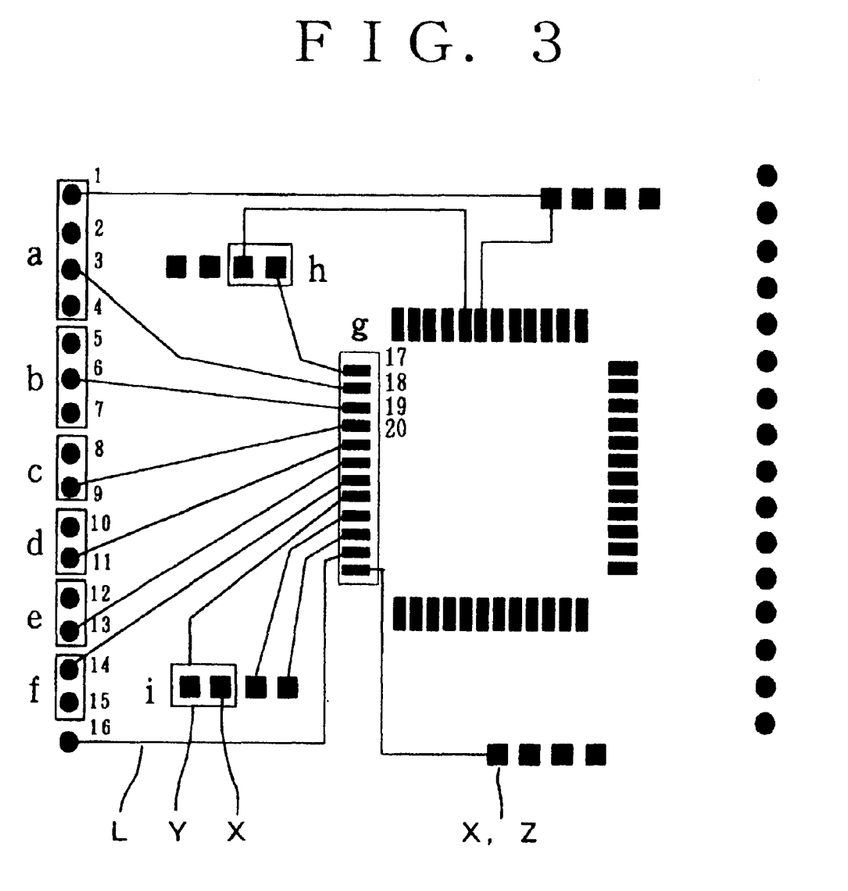
FIG. 3 illustrates inspection electrodes in an inspection adapter board according to an embodiment of the present invention and electrodes to be inspected on a board to be inspected in a state laid to overlap each other.

FIG. 3 illustrates inspection electrodes in an inspection adapter board (hereinafter referred to as "the first inspection adapter board") according to an embodiment of the present invention and electrodes to be inspected on a board to be inspected in a state laid to overlap each other (through-viewed state).

In FIG. 3, black rectangles, squares and circles indicate electrodes X to be inspected on a board to be inspected, while white rectangles designate common inspection electrodes Y of the inspection adapter board (not illustrated). In the inspection adapter board, inspection electrodes Z are formed correspondingly to other electrodes X to be inspected than those related to the common inspection electrodes.

The numbers attached to the electrodes X to be inspected are intended to specify the individual electrodes X, which are expressed by putting them in parentheses in the present specification, while the small English letters attached to the common inspection electrodes Y are intended to specify the individual common inspection electrodes Y, which are expressed by putting them in parentheses in the present specification.

As apparent from FIG. 3, each of the common inspection electrodes Y does not correspond to the individual electrodes X to be inspected in both shape and size and is formed in a state corresponding to a group of electrodes to be inspected composed of at least two electrodes X. In other words, each common inspection electrode Y is formed as an electrode having such shape, size and position that it comes into common contact with all the electrodes X belonging to the group of electrodes to be inspected.

More specifically, in the embodiment illustrated in FIG. 3, a common inspection electrode (a) is formed with such band-like shape, size and position that it commonly covers a group of electrodes to be inspected composed of 4 electrodes (1) to (4) to be inspected, a common inspection electrode (b) is formed with such shape, size and position that it commonly covers a group of electrodes to be inspected composed of 3 electrodes (5) to (7) to be inspected, and other common inspection electrodes (c) to (i) are also formed in a similar manner.

Each of the common inspection electrodes Y is required to be formed in a state that wiring networks formed independently from each other on the board to be inspected do not form an electrically closed circuit with each other through the common inspection electrode when the common inspection electrode is brought into contact with the board to be inspected for the purpose of inspection.

More specifically, each of the common inspection electrodes Y is to be electrically connected to all of the specified plural electrodes X at the same time, and so plural electrodes X which make up a group of electrodes to be inspected related to a certain common inspection electrode Y must belong respectively to wiring networks independent from each other.

A description is given with reference to FIG. 3. For example, 4 electrodes (1) to (4) to be inspected corresponding to the common inspection electrode (a) must belong respectively to 4 wiring networks independent from one another. When that is not the case, for example, the electrodes (2) and (3) belong to the same wiring network, the wiring network related to the electrodes (2) and (3) is short-circuit through the common inspection electrode (a) when the common inspection electrode (a) is brought into contact with the electrodes (1) to (4), thereby forming an electrically closed circuit. Accordingly, it is impossible to carry out electrical inspection with high reliability.

In the first inspection adapter board, the common inspection electrodes Y are formed in a state that the above-described conditions have been satisfied. Therefore, the necessary inspection for electrical conduction can be carried out on all wiring networks on a board to be inspected by using this adapter board.

A specific description is given with reference to the embodiment illustrated in FIG. 3. Assuming that wirings are made on the board to be inspected as indicated by fine lines L, in order to carry out the necessary inspection, i.e., conduction inspection between electrodes X related to all wirings, the inspection is carried out to inspect whether all pairs of electrodes belonging to each of wiring lines independent from each other are electrically conducted or not as usual.

When the first inspection adapter board is used, however, the same inspection can be conducted without inspecting all the pairs of electrodes to be inspected.

For example, the conduction inspection between the common inspection electrodes (a) and (g) is equivalent to the conduction inspection between the electrode (3) to be inspected and an electrode (18) electrically connected thereto, and the conduction inspection between the common inspection electrodes (b) and (g) is equivalent to the conduction inspection between the electrode (6) to be inspected and an electrode (19) electrically connected thereto.

Results equivalent to those in the case where electrical conduction is inspected on all pairs of electrodes to be inspected can be obtained by inspecting electrical conduction as to all combinations of the common inspection electrodes Y and other inspection electrodes Z than the common inspection electrodes Y in the inspection adapter board in a similar manner.

From the above fact, the first inspection adapter board can bring about the following effects.

(a) Since an inspection adapter board, on which inspection electrodes have been arranged at a pitch wider than the minimum pitch between electrodes to be inspected on a printed board to be inspected, can be used as an inspection adapter board for carrying out the necessary conduction inspection for the board to be inspection, the burden imposed on the design of wiring in the inspection adapter board is reduced to a great extent, and moreover the burden imposed on the fabrication of the inspection adapter board is reduced. Further, the conditions for alignment of the inspection adapter board with the board to be inspected are moderated.

(b) It is possible to inspect the electrical conduction of a board to be inspected having a larger number of electrodes to be inspected than the inspection capacity of a tester.

As apparent from the above description as to FIG. 3, in the first inspection adapter board, the number of inspection electrodes (including common inspection electrodes) to be provided on the first inspection adapter board, which are necessary for the conduction inspection between all pairs of electrodes to be inspected on a board to be inspected, becomes far smaller than the number of the electrodes to be inspected. As a result, the number of terminal electrodes (grids) to be connected to a tester can be reduced compared with the total number of the electrodes to be inspected, so that the conduction inspection between a larger number of pairs of electrodes to be inspected can be carried out even by a tester having a smaller inspection capacity.

As described above, the first inspection adapter board is characterized in that a common inspection electrode acting commonly on plural electrodes to be inspected belonging to one group of electrodes to be inspected is provided. In order to realize such corresponding relation between the inspection electrodes and the electrodes to be inspected, plural electrodes to be inspected belonging to one group of electrodes to be inspected may not be always those which are arranged in close vicinity to one another in a definite region so far as they form a group of electrodes to be inspected in electrical relation with each other.

In the first inspection adapter board, inspection electrodes (including common inspection electrodes) arranged at positions distant from each other may be connected electrically to each other by additional connecting wirings.

Figure 4:
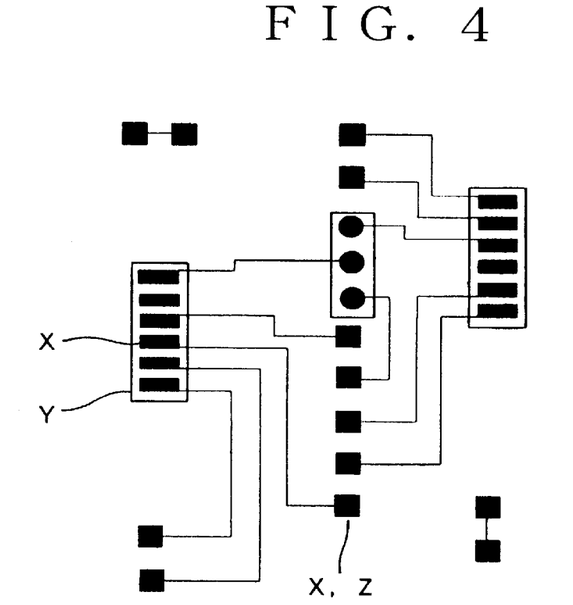
FIG. 4 illustrates inspection electrodes according to another embodiment of the present invention and electrodes to be inspected on a board to be inspected in a state laid to overlap each other.

More specifically, FIG. 4 illustrates the same state as in FIG. 3, i.e., the state that arrangements of electrodes to be inspected and inspection electrodes have been laid to overlap each other. Black rectangles, squares and circles indicate electrodes X to be inspected of a board to be inspected, while white rectangles designate common inspection electrodes Y of an inspection adapter board. In the inspection adapter board, inspection electrodes Z are provided correspondingly to other electrodes X to be inspected than those related to the common inspection electrodes Y. In a wiring example illustrated in FIG. 4, it is understood that the number of electrodes to be inspected is 28 electrodes in total of 10 electrodes in a left region, 10 electrodes in a central region and 8 electrodes in a right region, whereas the number of inspection electrodes is reduced to 16 electrodes in total of 5 electrodes (1 common inspection electrode Y and 4 inspection electrodes Z) in the left region, 8 electrodes (1 common inspection electrode Y and 7 inspection electrodes Z) in the central region and 3 electrodes (1 common inspection electrode Y and 2 inspection electrodes Z) in the right region.

Figure 5:
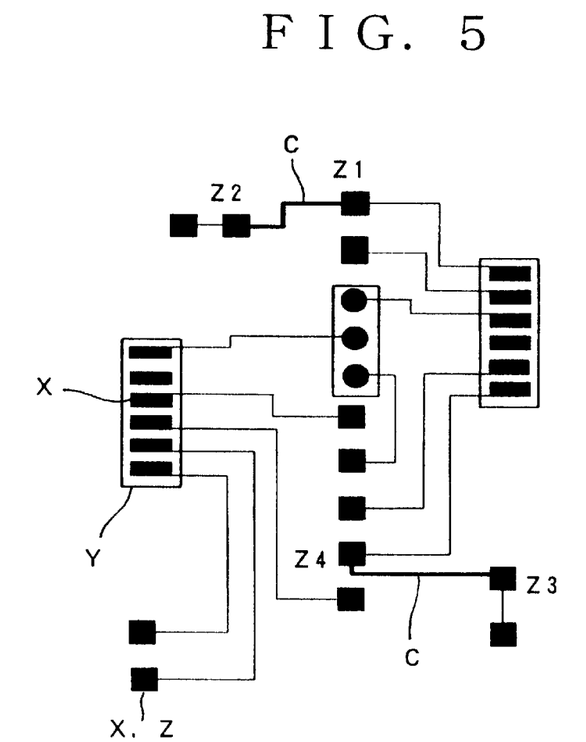
FIG. 5 illustrates a version of the case illustrated in FIG. 4.

In an example illustrated in FIG. 5, each two inspection electrodes, Z1 and Z2, and Z3 and Z4 in the example illustrated in FIG. 4 are electrically connected by 2 connecting wirings C indicated by thick lines. In this case, for example, the inspection electrodes Z1 and Z2 come to have action as a common inspection electrode to each other. As a result, in the example in FIG. 5, the total number of independent inspection electrodes, i.e., the common inspection electrodes Y and the uncommonized inspection electrodes Z, can be reduced to 14 electrodes, so that the number of terminal electrodes to be provided on the inspection adapter board is further reduced. Therefore, a tester used may have a capacity capable of inspecting only 14 inspection points.

In general, one of the most important problems upon the design of an inspection adapter board is to efficiently wire to electrically connect the inspection electrodes arranged on one side of a board and the terminal electrodes (grids) arranged on the other side. As a manner of course, this wiring operation is more difficult as the total number of inspection electrodes increases, or the electrode density heightens. Accordingly, the reduction in the total number of the independent inspection electrodes as described above means that it is possible to wide a pitch between inspection electrodes, and the design of wiring becomes easy. As a result that the wiring operation becomes easy, it is possible to form thicker wiring lines and larger via holes, so that the burden imposed on the fabrication or production is also reduced.

In the existing circumstances that the difficulties of both design and fabrication of an inspection adapter board are increased with the miniaturization of electrodes and heightening of arrangement density of electrodes on a printed board as described above, it is quite unpractical to fabricate an inspection adapter board on which an inspection electrode is provided every inspection point as usual.

As a convenient method for coping with this, there has heretofore been used an inspection adapter board by which the conduction inspection between a plurality of minute electrodes to be inspected and other electrodes to be inspected, which are not very minute, is carried out without accurate distinction of the minute electrodes.

When a function of inspecting all wirings within a board to be inspected cannot be incorporated into one inspection adapter board, a method, in which the wirings are divided by a proper method to fabricate plural inspection adapter boards respectively corresponding to the divided wiring portions, and inspection is conducted every wiring portion, has also been carried out.

However, these methods do not take mutual relation between inspection electrodes corresponding to plural electrodes to be inspected into consideration. Therefore, there is naturally a limit to these methods.

On the other hand, in the present invention, the number of inspection electrodes in the inspection adapter board can be reduced. Therefore, the necessary inspection for all electrodes to be inspected can be carried out by one inspection adapter board while reducing the burdens imposed on the capacity of a tester and the design and fabrication of the inspection adapter board, and in the state that the conditions for alignment of the inspection adapter board with the board to be inspected have been moderated. It is hence understood that the present invention has an extremely great technical effect in this point.

According to the first inspection adapter board, the common inspection electrode is electrically connected commonly to plural electrodes to be inspected. Therefore, complete inspection results as to insulation among wiring networks formed independently from each other within a board to be inspected cannot be obtained at the same time. In other words, insulation inspection cannot be conducted.

In order to conduct the insulation inspection, the present invention provides another inspection adapter board (hereinafter referred to as "the second inspection adapter board"). The second inspection adapter board has, as a representative inspection electrode, an inspection electrode corresponding to one electrode to be inspected (hereinafter referred to as the "representative electrode to be inspected") properly selected from among many electrodes to be inspected belonging to each of independent wiring networks on a board to be inspected.

Necessary inspection as to insulation can be carried out with certainty by using this adapter board for the inspection of insulation.

Since the representative electrode to be inspected corresponding to the representative inspection electrode may be any one among the electrodes to be inspected in each wiring network, an electrode to be inspected having the greatest size, or an electrode to be inspected most distant from adjacent electrodes, for example, may be selected as the representative electrode to be inspected. Accordingly, inspection electrodes in the adapter board for the insulation inspection, namely, representative inspection electrodes can be formed considerably low in arrangement density and large in average size compared with those of the electrodes to be inspected of the board to be inspected. Therefore, the design and fabrication thereof are very easy.

The fact that two inspections of the conduction inspection and the insulation inspection are carried out on one board to be inspected as described above comes to incur an increase in operation step as far as it goes. However, an advantage that the design and fabrication of the inspection adapter boards become easy is obtained and moreover effects attendant on this, such as reduction in cost and shortening in period of time, are brought about to a great extent, on the whole. Therefore, far marked merits are obtained even when the above-described disadvantage is taken into consideration.

Figure 6:
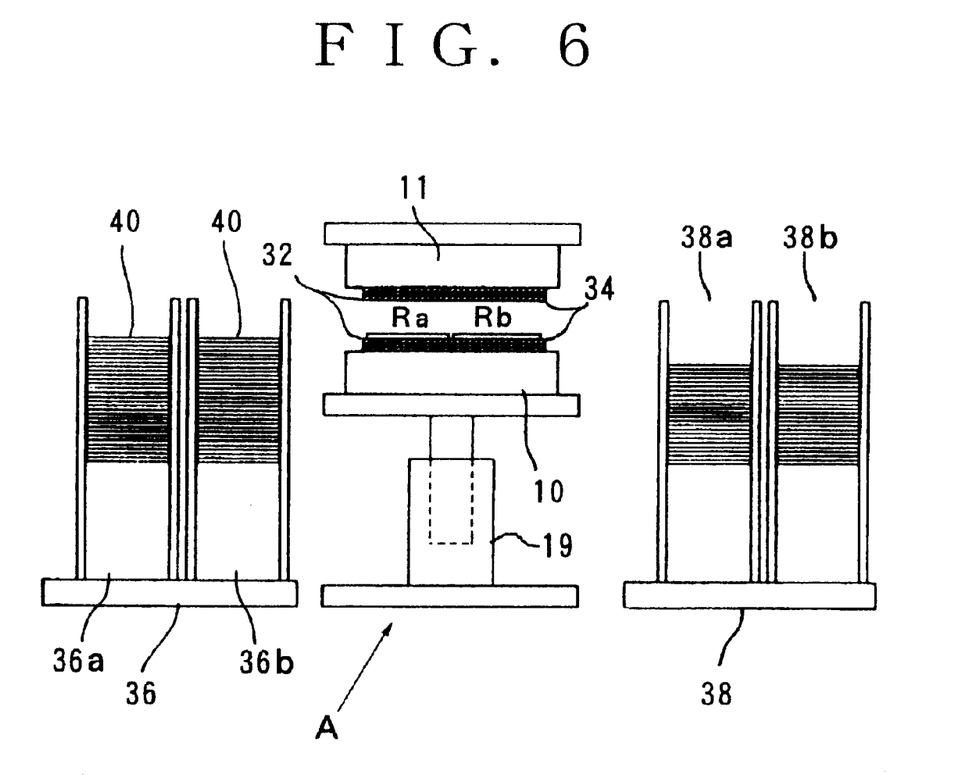
FIG. 6 illustrates an apparatus by which the inspection method for printed board according to the present invention can be carried out with high efficiency.

FIG. 6 illustrates a printed board inspecting apparatus according to the present invention by which conduction inspection and insulation inspection for printed boards to be inspected can be carried out with high efficiency.

In the printed board inspecting apparatus, reference symbol A indicates an inspection head mechanism which has basically the same construction as the inspection head mechanism illustrated in FIG. 2. The operation thereof is controlled by the same inspection control mechanism (not illustrated) as in FIG. 2.

On both lower head 10 and upper head 11 of the inspection head mechanism A in the inspection apparatus, the first inspection adapter boards 32 for the conduction inspection and the second inspection adapter boards 34 for the insulation inspection are mounted, respectively, in a first region Ra and a second region Rb thereof, which are located side by side. These adapter boards may have been mounted on a common base.

On both sides of the inspection head mechanism A, board stockers 36 and 38 are respectively provided. The board stocker 36 has a double-stocker structure that a first stocker part 36a and a second stocker part 36b are arranged side by side like the first and second regions Ra and Rb. Similarly, the board stocker 38 also has a double-stocker structure that a first stocker part 38a and a second stocker part 38b are arranged side by side. In each of the board stockers 36 and 38, the two stocker parts may be adjusted in a distance between them and respective sizes according to the sizes of boards 40 to be inspected actually subjected to inspection.

Upon the inspection, the same kind of two boards 40 to be inspected, which have been fabricated on the basis of the same design, are first arranged on the first and second regions Ra and Rb of the lower head 10, respectively, at the same time from the first and second stocker parts 36a and 36b of the board stocker 36 by means of, for example, a rail conveyor or robot conveyor.

In the inspection head mechanism A, the lower head 10 is then pressed against the upper head 11 by means of a drive mechanism 19 to simultaneously subject the two boards 40 to the conduction inspection by the first inspection adapter boards 32 in the first region Ra and the insulation inspection by the second inspection adapter boards 34 in the second region Rb. After completion of the inspections, the two boards 40 are taken out at the same time and contained in the first and second stocker parts 38a and 38b of the other board stocker 38, respectively.

After the above-described tests are completed on all the boards to be inspected within the board stocker 36, the boards contained in the other board stocker 38 are returned to the board stocker 36 with the mutual positions of the two boards inspected at the same time changed. More specifically, the boards to be inspected contained in the first stocker part 38a of the other stocker 38 are returned to the second stocker part 36b of the stocker 36, while the boards to be inspected contained in the second stocker part 38b of the other stocker 38 are returned to the first stocker part 36a of the stocker 36. Thereafter, the same tests as described above are made.

In the above-described manner, all the boards 40 to be inspected are subjected to both conduction inspection by the inspection adapter board 32 and insulation inspection by the inspection adapter board 34.

According to such an inspection apparatus, the necessary conduction inspection and insulation inspection for the boards 40 to be inspected can be carried out with high efficiency.

According to the inspection adapter boards of the present invention, printed boards having electrodes miniaturized and heightened in density can be subjected as boards to be inspected to the necessary conduction inspection or insulation inspection though the adapter boards have inspection electrodes smaller than the number of electrodes to be inspected and extremely high in flexibility of size and arrangement density. Accordingly, in each inspection, a small capacity suffices for a tester.

The necessary inspections for the boards to be inspected can be carried out with certainty by carrying out both conduction inspection and insulation inspection, and moreover simple inspection adapter boards suffice for the respective inspections. Therefore, the design and fabrication thereof become easy, and a small capacity suffices for a tester. Further, the necessary inspections for a great number of printed boards can be carried out with extremely high efficiency by utilizing the above-described inspection adapter boards.

According to the first and second inspection adapter boards, the limitations in the design and fabrication thereof are moderated to a great extent, and the flexibility becomes extremely high, so that practical effects attendant on this, such as reduction in cost and shortening in period of time, are brought about to a great extent. Therefore, far marked merits are obtained as a whole even when the disadvantage of the necessity of conducting both conduction inspection and insulation inspection is taken into consideration.

As described above, the first and second inspection adapter boards are fundamentally extremely excellent in that a great advantage is obtained. However, it has been found that the practical fabrication thereof involves some great problems.

For example, when the design of an inspection adapter board for inspecting a specific board to be inspected is manually made on the basis of the principle of each of the above-described inspection adapter boards, it takes at least several days to analyze the electrically connected state of electrodes to be inspected in the board to be inspected, and moreover it is necessary to conduct an operation for determining the positions and shapes of common inspection electrodes, which are considered to be optimum, and an input work for storing information obtained from this operation into a computer, or the like, for the purpose of subsequent processes.

In particular, in the operation for determining the conditions for the common inspection electrodes in the first inspection adapter board, specifically, the sizes, positions, etc. thereof, it is required to determine the conditions for the common inspection electrodes in such a manner that the number of electrodes to be inspected belonging to a group of electrodes to be inspected corresponding to one common inspection electrode becomes more and that more number of the common inspection electrodes can be formed. When the conditions for the common inspection electrodes are determined carelessly, however, there is a possibility that some electrodes to be inspected may be excluded from the subject of inspection. Accordingly, this operation must be carefully conducted by a person who understands fully the object and principle thereof. In addition, it takes an extremely long time, for example, about 2 weeks or longer to conduct the operation though it varies according to the scale of a board to be inspected and the complexity of electric circuits thereon.

In general, the basic rule in the design of a printed board follows many systems according to various conditions such as the kind of apparatus or instrument (for example, telephone, controller of machine tool, game machine, or the like), in which the printed board is incorporated, application field (apparatus or instrument for public welfare, industrial use, military use, or the like.), the kind of electric signals to be processed (analog signals, digital signals or combination thereof), and service environment (portable type or stationary type). As a result, the details of design (the number, shapes, sizes and arrangements of electrodes, and wiring networks which are electrically connected bodies between or among the electrodes) of the board to be inspected are in infinite variety. Therefore, there is no common method for producing information as to inspection adapter boards, which can be applied without any modification to all cases.

As described above, the fabrication of the first inspection adapter board involves a problem that in particular, the design thereof requires an extremely long operation step compared with the conventional inspection adapter boards having inspection electrodes corresponding to individual electrodes to be inspected.

On the other hand, even in the fabrication of the second inspection adapter board having the representative inspection electrodes, circumstances are fundamentally the same as the case of the first inspection adapter.

According to the present invention, there are provided a method and apparatus for producing information, which will be described subsequently, in order to solve such a problem.

Basic circumstances as to 2 kinds of inspection adapter boards to be fabricated according to this information producing method are confirmed as follows:

(A) First Inspection Adapter Board for the Conduction Inspection:

In the first inspection adapter board for the conduction inspection, common inspection electrodes are provided according to the specific conditions. The conditions include the following three conditions.

(a) Each of the common inspection electrodes is that coming into contact with plural electrodes to be inspected at the same time.

(b) An electrode to be inspected belongs to any one of wiring networks in a board to be inspected, but each of plural electrodes to be inspected corresponding to one common inspection electrode belongs to respective wiring networks formed independently from each other.

(c) Any circuit formed by each wiring network in the board to be inspected and each inspection electrode in the inspection adapter board does not form a closed circuit when the inspection adapter board is brought into contact with the board to be inspected for the purpose of electrical inspection.

According to an inspection adapter board having the common inspection electrodes formed in accordance with the above conditions (a) to (c), the conduction inspection for all wiring networks in a board to be inspected can be conducted every wiring network independently. This may be apparent from the description already stated in the embodiment illustrated in FIG. 3.

(B) Second Inspection Adapter Board for the Insulation Inspection:

In the design of the second inspection adapter board for the insulation inspection, it is conducted to select only one electrode as a representative electrode to be inspected from each of wiring networks in a board to be inspected. More specifically, the insulation inspection is carried out by checking the fact that, when a certain voltage is applied to a representative electrode to be inspected in one wiring network to which electrodes to be inspected as the subject of inspection belong, no flow of electric current is detected at every other representative electrode to be inspected, and successively repeating this process about all representative electrodes to be inspected. Once the above checking process is completed about all combinations of the representative electrodes to be inspected, the intended insulation inspection is completed.

This insulation inspection can bring about the following effects.

(i) The capacity of a tester in a printed board inspecting apparatus can be made smaller than that corresponding to electrodes to be inspected on a board to be inspected.

(ii) A pitch between inspection electrodes in the inspection adapter board can be made wider than the minimum pitch between electrodes to be inspected on a printed board to be inspected.

The information producing method and apparatus according to the present invention will hereinafter be described in detail with a background of the above-described circumstances.

In the present invention, in order to fabricate the first inspection adapter board used in the conduction inspection and the second inspection adapter board used in the insulation inspection as to a certain board to be inspected, the following steps are basically executed.

(1) A step of inputting information as to electrodes to be inspected on the board to be inspected;

(2) A step of producing information as to inspection electrodes of the first inspection adapter board;

(3) A step of producing information as to inspection electrodes of the second inspection adapter board; and (4) A step of outputting the information produced.

These steps will hereinafter be described in detail.

(1) Step of Inputting Information as to Electrodes to be Inspected on a Board to be Inspected:

This step is a step of reading, as basic information, geometric information, such as relative positions, shapes and sizes, of electrodes to be inspected on a printed board to be inspected, and information, as to electrical connection between the electrodes to be inspected i.e., information as to electrical conduction or insulation, into a medium processed by a computer or any other information processing apparatus.

No particular limitation is imposed on a source of information as the subject of input in this step so far as it gives the above-described information as to the board to be inspected. For example, design information as to the board to be inspected, and information obtained by analyzing an actual printed board may be used. Information as to an inspection adapter board in accordance with the conventional method for inspecting a board to be inspected as the subject of inspection may also be used as a source of information, since the information is substantially equivalent to the above-described information as to the electrodes to be inspected.

A general means for reading the basic information into is a method in which a recording medium such as a removable hard disk, floppy disk, MO, magnetic tape or CD-R is used. However, as an inputting means, it is also possible to directly read the information into by means of a communicating means such as Internet, LAN or personal computer communication. Manual input may also be conducted. However, the manual input takes a long time for input and has a great possibility that an error of input may be made. Therefore, the manual input is disadvantageous except for cases such as slight correction upon change of design.

(2) Step of Producing Information as to Inspection Electrodes of the First Inspection Adapter Board:

This step is a step of forming some electrodes to be inspected into a group on the basis of the geometric information and information as to electrical connection of the electrodes to be inspected inputted by the step (1), and obtaining information as to a common inspection electrode corresponding to this group.

This step is divided into 2 stages of a grouping processing for forming a group of electrodes to be inspected and a common electrode forming processing.

(2-1) Grouping Processing:

The electrodes to be inspected are divided into groups in such a manner that the capability (capacity) of a printed board inspecting apparatus or tester actually used in the inspection of a board to be inspected, and the capacity of wirings in the inspection adapter board as well as the capacity of wirings in the board to be inspected are efficiently utilized to achieve high inspection efficiency. More specifically, the grouping is conducted in accordance with the following procedure under the following conditions.

[a] Conditions of Electrodes to be Inspected to Belong to the Same Group:

With respect to all or part of electrodes to be inspected, plural electrodes to be inspected, which should belong to the same group, are selected mainly on the basis of geometric information such as the sizes, relative positions and shapes of actual electrodes, and intervals between adjacent electrodes.

More specifically, at least one item selected from the following items [a-1] to [a-5] of conditions is applied, and plural electrodes to be inspected corresponding to the item are selected as those belonging to the same group. The numerical value indicated in each item is an example of a threshold value and is not an absolute or limited value. When plural items are applied in combination, weightings may be conducted on respective items as needed, whereby more preferable results can be obtained.

[a-1] Being electrodes the center distance between which is short (for example, 1,000 μm or shorter);
[a-2] Being electrodes the interval from an adjacent electrode of which is short (for example, 500 μm or shorter);
[a-3] Being electrodes which are positioned at a high density in a narrow region (for example, 30 electrodes/cm$^2$ or higher);
[a-4] Being electrodes which follow a specific arrangement, for example, electrodes arranged in the form of a lattice corresponding to an integrated circuit; and
[a-5] Being electrodes particularly suitable for being grouped, in addition.

[b] Conditions of Electrodes to be Inspected to be Excluded from the Same Group:

With respect to all or part of electrodes to be inspected, electrodes to be inspected, which should be excluded from the same group, are selected mainly on the basis of information as to electrical connection so that electrically independent inspection is feasible.

All of the following items of conditions are generally applied, and electrodes to be inspected corresponding to the items are excluded. However, the corresponding items may not be applied in some cases, for example, in the case where it is apparent that no breaking of wire has formed in the fabrication.

[b-1] Being one electrode among electrodes contained in the same wiring network;
[b-2] Being electrodes to be electrically connected through another group; and
[b-3] Being electrodes particularly unsuitable for being grouped.

[C] Other Conditions:

The following conditions may be added though they are not essential conditions related to the grouping processing. By these conditions, the grouping processing can be executed quickly and accurately, and the execution of inspection and the analysis of inspection results can be conducted with more ease. These items of conditions are applied either singly or in any combination thereof. When the items are applied in combination, weightings may be conducted on respective items, whereby more preferable results can be obtained. These items may not be applied at all in some cases unlike the above items [a] and [b].

Examples of these limitations include a limitation by setting either one or both of the upper limit and the lower limit, and a limitation by setting a certain tolerance or forbidden range. These limitations may be set in combination. The respective limitations may be actually provided as direct or indirect limitations in the form of number such as the total number of electrodes to be inspected, area such as ratio of the total area of electrodes to be inspected to the whole area of the printed board to be inspected, arrangement density of electrodes, etc. in some cases.

[c-1] A limitation being imposed on the total number of electrodes belonging to a group.
[c-2] A limitation being imposed on the total number of electrodes grouped in the whole board to be inspected.
[c-3] A limitation being imposed on an area occupied by a group.
[c-4] A limitation being imposed on the number of groups formed.
[c-5] A limitation being imposed on a distance between groups formed, and/or on the size of interval.
[c-6] A limitation being imposed on a distance between elements composed of groups formed and electrodes to be inspected not belonging to any group, and on the size of interval.
[c-7] A limitation being imposed on the total number of electrodes grouped to form a wiring network.
[c-8] A limitation being imposed on the electrodes belonging to a group so that figure of region of the corresponding common inspection electrode to be formed may become easy to be processed.

The procedure for applying the above items to electrodes to be inspected on a board to be inspected to form groups can be selected from the following three methods by the order of application.

Procedure (1):

The items belonging to [a] and the items belonging to [b] are simultaneously applied to all electrodes on a board to be inspected sucessively to conduct grouping and exclusion at the same time.

Procedure (2):

The items belonging to [a] are first applied to all electrodes on a board to be inspected to form provisional groups, and electrodes corresponding to the items belonging to [b] are then excluded, thereby forming final groups.

Procedure (3):

The items belonging to [b] are first applied to all electrodes on a board to be inspected to exclude electrodes unsuitable for being grouped, and the items belonging to [a] are then applied to form groups.

Upon practical processing, the procedure (1) is simple and can provide standard results as to both number of common inspection electrodes corresponding to formed groups of electrodes to be inspected and speed of the grouping processing.

According to the procedure (2), the quality of common inspection electrodes to be formed is improved compared with the case of the procedure (1). However, the procedure requires a great working space in a processing system.

According to the procedure (3), the speed of the grouping processing becomes high. However, there is a possibility that electrodes corresponding to the items belonging to [b] may be newly produced by grouping when the arrangement of the electrodes to be inspected is complicated. Therefore, it is preferred to conduct check again.

From the above fact, it is preferred that the procedure (2) be selected when an adapter board designing system has sufficient processing speed and working space for the complexity and scale of a board to be inspected, and the procedure (1) or (3) be selected in other cases than that.

Further, as methods for excluding electrodes corresponding to the items belonging to [b], the following two methods may be selected.

Exclusion Method (1):

A method in which electrodes are simply excluded from the corresponding provisional group or a candidate for grouping.

Exclusion Method (2):

A method in which a provisional group is divided into plural groups.

In this exclusion processing of electrodes, in some cases, there may be room for selection in electrodes to be excluded and exclusion method. In such a case, electrodes to be actually excluded and the exclusion method may be determined by reference to geometric information such as the sizes, shapes, relative positional relation of the electrodes, intervals between adjacent electrodes, and when following a specific arrangement, the regularity of the arrangement, in addition to the information as to electrical connection of the electrodes.

In the above description, the case where the electrodes to be inspected on the board to be inspected are processed all together has been described for the sake of easy understanding. However, there may be used a method in which area of a board to be inspected is divided into plural sections, and electrodes within each section are successively subjected to the grouping processing as described above. The method of executing the processing every section has a merit that working spaces required of the information processing apparatus and processing system may be narrow. However, a group naturally comes to be divided at a boundary between sections. It is hence necessary to take this into consideration.

With respect to the items belonging to [c], it is necessary to apply the item at proper timing according to the limitation.

In the above-described grouping processing, there is a possibility that an item or procedure selected for the processing may not be suited to a board to be inspected, and so the processing may not be completed, or no expected results may be obtained even when the processing has been completed. In such a case, its threshold value may be changed, or the combination of items may be changed, and the processing is then conducted again, whereby the intended results can be obtained.

(2-2) Common Electrode Forming Processing:

This processing is a processing in which electrodes to be inspected belonging to the same group determined by the above grouping processing are electrically connected to each other on the date to form a virtual common electrode. By executing this processing, direct information as to common inspection electrodes of the intended inspection adapter board, i.e., the geometric information and information as to electrical connection thereof, can be obtained.

Means usable in the common electrode forming processing are roughly divided into the following three methods.

[a] Simply Electrically Connecting Means:

In this means, there is conducted an operation in which electrodes belonging to one group are actually connected to each other by a line having a width in a display of a predetermined inspection adapter board, in which, for example, electrodes to be inspected are displayed overlappedly.

[b] Means wherein Voluntary Regions Respectively Corresponding to Electrodes Belonging to one Group are Assumed to Utilize Their Overlaps:

Specific means thereof are as follows.

[b-1] Means wherein a circle having a suitable radius is drawn with a certain point within the region of each of electrodes belonging to one group for its center to find a state that a circle according to one electrode overlaps another circle related to any other electrode, and a region within its outline contour is regarded as a common electrode forming region; and

[b-2] Means wherein each of electrodes belonging to one group is enlarged while retaining the similar figure of its contour, thereby finding a state that a region related to one enlarged electrode overlaps another region related to any other enlarged electrode, and a region within its outline contour is regarded as a common electrode forming region.

[c] Means wherein a Common Electrode Forming Region of a Polygon, in which All Electrodes Belonging to One Group is Included, is Found:

Specific means thereof are as follows.

[c-1] Means wherein a region of a rectangle, circle or any other shape, which surrounds all electrodes belonging to one group, is preset, and this region is regarded as a common electrode forming region;

[c-2] Means wherein polygons which are respectively circumscribed with electrodes belonging to one group are preset to conduct an operation that in each pair of optional polygons, all lines respectively connecting one of vertexes of one polygon and one of vertexes of the other polygon are listed up about the pair of polygons and this line listing up work is repeated about every pair of polygons so that every line is listed up which connects every pair of vertexes of every pair of polygons, lines crossed with one another are excluded from a group of all the lines thus obtained, and a region surrounded by a polygon formed by a group of remaining lines is regarded as a common electrode forming region; and

[c-3] Means wherein polygons which are respectively circumscribed with electrodes belonging to one group are preset, and a region surrounded by a polygon formed by regarding a point of a vertex located most distantly along X axis or Y axis among vertexes of the preset polygons as a starting point to successively connect vertexes located most outside among vertexes within a certain distance range by a straight line counterclockwise or clockwise is regarded as a common electrode forming region.

These methods may be used each in its proper way according to the conditions of individual groups. It is hence unnecessary to unifically apply a specific means to a board to be inspected. In fact, an unnecessary part may be included in the resultant common electrode forming region in some cases. In this case, the unnecessary part can be deleted.

In any method, there is actually a possibility that an electrode in a state excluded from the formed common electrode forming region although the electrode should belong to the group concerned, or contrary thereto, an electrode being in contact with or overlapped with the formed common electrode forming region although the electrode should belong to a group other than the group concerned. Therefore, it is necessary to check the fact that such inconvenience is not caused. It is desirable to use a system that conditions and methods are changed to execute processing again if the inconvenience is caused.

(3) Step of Producing Information as to Inspection Electrodes of the Second Inspection Adapter Board:

This step is a step of, based on the geometric information and the information as to electrical connection of the electrodes to be inspected inputted by the step (1), producing information for fabricating the second inspection adapter board used in the inspection as to insulating property between wiring networks in the board to be inspected.

This step is divided into 2 stages of a selecting processing of representative electrodes to be inspected, in which representative electrodes to be inspected for respectively applying a certain voltage to wiring networks to be inspected or for detecting flow of electric current are selected, and a selecting processing of monitoring electrodes to be inspected, in which monitoring electrodes to be inspected for checking the fact that the representative electrodes to be inspected are exactly electrically connected to representative inspection electrodes when brought into contact with the inspection adapter board are selected.

(3-1) Selecting Processing of Representative Electrodes to be Inspected:

The representative electrodes to be inspected are electrodes for respectively applying inspection voltage to wiring networks in a board to be inspected as the subject of inspection, and one electrode is selected every wiring network. The representative electrode to be inspected can be utilized as a probe electrode for detecting short circuit between the wiring network and any other wiring network.

Electrodes to be inspected satisfying the following conditions are selected as the representative electrodes to be inspected.

Condition 1:
Being an electrode having a size ensuring mechanical contact sufficient to achieve stable electrical connection with an inspection electrode. Accordingly, an electrode having the greatest area in each wiring network is generally selected as a representative electrode to be inspected.

Condition 2:
Being an electrode having a shape of square, circle or the like in order that it may easily achieve the contact with an inspection electrode.

Condition 3:
Being an electrode present in a region low in electrode density.

(3-2) Selecting Processing of Monitoring Electrodes to be Inspected:

Each of the monitoring electrodes is selected from among electrodes to be inspected in a state of electrical conduction to any one of the representative electrodes to be inspected as above.

A monitoring inspection electrode formed on the inspection adapter board correspondingly to this monitoring electrode to be inspected, and a representative inspection electrode formed on the inspection adapter board correspondingly to the representative electrode to be inspected can be used to check electrical conduction between the monitoring electrode to be inspected and the representative electrode to be inspected, thereby checking the state that the representative inspection electrode is in exact contact with the representative electrode to be inspected, so that voltage necessary for the wiring network is being applied.

In order to check the electrical connection with the representative inspection electrode, it is ideal to select one monitoring electrode to be inspected per each wiring network. However, several to ten-odd electrodes suffice for the whole board to be inspected from the viewpoint of practical use.

It is preferred that the selection of the monitoring electrodes to be inspected should satisfy the following conditions.

Condition 1:
A monitoring electrode to be inspected is to be an electrode smaller than all of the related representative electrodes to be inspected.

Condition 2:
A monitoring electrode to be inspected is to be an electrode having a shape of square, circle or the like in order that it may easily achieve the contact with a monitoring inspection electrode.

Condition 3:
Some of plural monitoring electrodes to be inspected are to be generally present at 4 corners of a board to be inspected, or in regions close thereto.

Condition 4:
Monitoring electrodes to be inspected are to be distributed throughout a board to be inspected.

By selecting monitoring electrodes to be inspected satisfying the above conditions, the fact that the representative inspection electrodes in the inspection adapter board are in a state exactly electrically connected to the representative electrodes to be inspected distributed over whole area of the board to be inspected is ensured with satisfactory accuracy from the viewpoint of practical use by checking electrical connection between said monitoring electrodes to be inspected and monitoring inspection electrodes in the inspection adapter board.

(4) Step of Outputting the Information Produced:

This step is a step of outputting the information obtained in the information producing step of (2) as information for designing the first inspection adapter board, and outputting the information obtained in the information producing step of (3) as information for designing the second inspection adapter board.

In the design of the first inspection adapter board, a single virtual common electrode is specifically assumed by the common electrode forming processing and fabricate an actual common inspection electrode correspondingly to a region occupied by the virtual common electrode, i.e., a common electrode forming region. Accordingly, when the geometric information and information as to electrical connection of the common electrodes, which have been produced by the above-described processing, are outputted, provided are geometric information for actually determining conditions such as the positions, shapes and sizes of common inspection electrodes to be formed in the first inspection adapter board, and specific information for creating an electrically connected state to be achieved in the common inspection electrodes. Accordingly, such information can be utilized to design the first inspection adapter board for conduction inspection for the intended board to be inspected.

Incidentally, in the usual case, besides the common inspection electrodes, uncommonized inspection electrodes individually corresponding to electrodes to be inspected are also present in the inspection adapter board. In this case, the information as to electrical connection naturally includes that as to these uncommonized inspection electrodes.

It is preferable to output additional information indicating the belonging relation between the common inspection electrodes to be formed and their corresponding electrodes to be inspected together with the information described above. It is more preferable to output information as to electrical connection between electrodes to be inspected which are brought to the state of electrical conduction or insulation according to the common inspection electrodes to be formed. The output of such additional information has, for example, a merit that date used for the inspection in an board inspecting apparatus can be produced from such information.

In the design of the second inspection adapter board, when the geometric information and information as to electrical connection of the selected representative electrodes to be inspected and monitoring electrodes to be inspected are outputted, provided are geometric information for actually determining conditions such as the positions, shapes and sizes of representative inspection electrodes and monitoring inspection electrodes to be formed in the second inspection adapter board, and specific information for creating an electrically connected state to be achieved in the representative inspection electrodes and monitoring inspection electrodes. Accordingly, such information can be utilized to design the second inspection adapter board for insulation inspection for the intended board to be inspected.

The information in the respective steps described above is not always required to be brought together in one file, and may be divided into plural files according to the nature and degree of importance of the information, and subsequent steps.

As means for outputting the information, there may be used a writable recording medium such as a removable hard disk, floppy disk, MO, magnetic tape or CD-R. Besides, it is also possible to directly output the information into a computer, which controls a subsequent process, by means of a communicating means such as Internet, LAN or personal computer communication. The necessary information may be displayed on a display in order that an operator may confirm the progress and results of processing.

In the above processing, when identification marks for individually identifying the electrodes to be inspected, groups of electrodes to be inspected, representative electrodes to be inspected and monitoring electrodes to be inspected in the board to be inspected are applied in advance, it is possible to identify or indicate them in output or input by the identification marks. In this case, as the identification marks, there may be used numbers, symbols by letters and/or the like, individual names, and other codes or signs.

By the processing through the respective steps of (1) to (4), the information necessary for actually fabricating the first and second inspection adapter boards, particularly, specific and direct information as to the common inspection electrodes, representative inspection electrodes and monitoring inspection electrodes to be formed, namely, the geometric information and information as to electrical connection thereof can be produced in an extremely short period of time. Several minutes to ten-odd minutes suffice for the actual time required.

The combinations of conditions and threshold values used in individual stages of the processing in each of the above-described steps are required to be built into an information processing apparatus or processing system in advance. However, in the case where change of setting is allowed as needed, it is possible to execute exceptional processing, which is advantageous in that the range of boards to be inspected as the subject of inspection becomes wider.

It is generally necessary to fabricate and use the first and second inspection adapter boards as a set. Accordingly, the information processing apparatus or processing system is preferably preset so as to automatically execute the whole processing according to all the steps described above. However, in some cases, boards to be inspected may be subjected to either one of conduction inspection and insulation inspection. For such a case, it is possible to preset the processing system so as to cope with the design alone of any one of the first and second inspection adapter boards.

Further, in each of the above steps, it is also possible to execute the information processing so as to produce plural results according to different preset conditions. In this case, the details of respective designs are compared with each other to choose the optimum design for use, thereby obtaining an inspection adapter board having great reliability.

The first and second inspection adapter boards are fabricated in accordance with the details of design based on the information produced in the above-described manner. As specific fabricating means, there may be used the conventionally known means.

The first and second inspection adapter boards fabricated in such a manner are used to carry out conduction inspection and insulation inspection, respectively, for the board to be inspected, from which the basic information has been obtained.

Due to, in the conduction inspection, the fact that the first inspection adapter board has the common inspection electrodes, and in the insulation inspection, the fact that the second inspection adapter board has the representative inspection electrodes and monitoring inspection electrodes, the respective excellent effects already stated can be achieved.

The electrical performance of the board to be inspected can be checked with sufficiently high reliability by carrying out both conduction inspection and insulation inspection.

According to the method and apparatus of the present invention, the necessary processing can be executed in several minuets to ten-odd minutes though it varies according to the scale of a board to be inspected and the constructional complexity of wiring networks. In addition, the results thereof can be delivered to a subsequent process as it is, so that a great deal of shortening of the time required and saving of trouble in the design and fabrication of the inspection adapter boards can be achieved.

An operator actually participated in the information processing mainly conducts only the work of feeding the information as to the designated board to be inspected to a processing system of an information processing apparatus such as a personal computer, and the work of delivering the results of the information processing to a subsequent process as it is. There is hence no need to understand the characteristic principle and object of the process for these works, and only understanding of the fundamental operating way of the information processing apparatus suffices for the works. Therefore, the operator is not required to be an expert or a skilled hand, and any person can execute the processing with ease.

According to the present invention, the geometric information and information as to electrical connection of electrodes to be inspected in a board to be inspected are read into an information processing apparatus, for example, a personal computer, the grouping processing of the electrodes to be inspected and common electrode forming processing are executed on the basis of this information, and specific information as to the conditions of common inspection electrodes to be formed in an inspection adapter board is produced on the basis of the resultant information. The conditions necessary for the processing of such information are preset in the information processing apparatus or information processing system, or preset as conditions to be selected, whereby the geometric information and information as to electrical connection of common inspection electrodes to be formed in the intended inspection adapter board for conduction inspection can be produced in an extremely short period of time and with ease.

Moreover, according to the present invention, the geometric information and information as to electrical connection of electrodes to be inspected in a board to be inspected are read into the information processing apparatus, the selecting processing of representative electrodes to be inspected and the selecting processing of monitoring electrodes to be inspected are executed every wiring network on the basis of this information, and specific information as to the conditions of representative inspection electrodes and monitoring inspection electrodes to be formed in an inspection adapter board is produced on the basis of the resultant information. The conditions necessary for the processing of such information are preset in the information processing apparatus or information processing system, or preset as conditions to be selected, whereby the geometric information and information as to electrical connection of representative inspection electrodes and monitoring inspection electrodes to be formed in the intended inspection adapter board for insulation inspection can be produced in an extremely short period of time and with ease.

Further, according to the present invention, the intended inspection adapter board for conduction inspection having the common inspection electrodes, and the intended inspection adapter board for insulation inspection having the representative inspection electrodes and monitoring inspection electrodes can be fabricated extremely simply and easily on the basis of the information produced in the above-described manner. In addition, these inspection adapter boards have high reliability. Accordingly, the necessary conduction inspection and insulation inspection for a board to be inspected can be carried out with certainty and high reliability by using the inspection adapter boards.

What is claimed is:

1. An inspection adapter board for printed board, which is equipped with inspection electrodes at positions corresponding to the positions of plural electrodes to be inspected on a printed board to be inspected, and is used for the conduction inspection of the printed board, wherein:

at least one of the inspection electrodes is a common inspection electrode having a shape corresponding to a group of electrodes to be inspected, which is composed of at least two electrodes to be inspected, and the common inspection electrode is formed in a state that wiring networks formed independently from each other on the printed board to be inspected do not form an electrically closed circuit with each other through the common inspection electrode when the common inspection electrode is brought into contact with the printed board for the purpose of inspection.

2. The inspection adapter board according to claim 1, wherein a plurality of the inspection electrodes are electrically connected to each other by wirings.

3. An inspection adapter board for printed board, which is equipped with inspection electrodes, and is used for the insulation inspection of a printed board to be inspected, wherein at least one of the inspection electrodes is formed as a representative inspection electrode which is to be electrically connected to only one electrode to be inspected belonging to each of wiring networks to be inspected formed independently from each other on the printed board to be inspected at a position corresponding to said one electrode to be inspected.

4. The inspection adapter board according to claim 3, which comprises a monitoring inspection electrode electrically connected to the representative inspection electrode.

5. A method for inspecting a printed board, which comprises using the inspection adapter board according to claim 1 or 2 to carry out conduction inspection as to each of wiring networks formed on the printed board, and using the inspection adapter board according to claim 3 or 4 to carry out insulation inspection between the wiring networks formed on the printed board.

6. A method for inspecting printed boards, which comprises providing an inspection adapter board for carrying out conduction inspection as to each of wiring networks formed on a printed board to be inspected and an inspection adapter board for carrying out insulation inspection between the wiring networks side by side, and placing printed boards to be inspected respectively on these adapter boards for conduction inspection and for insulation inspection to carry out conduction inspection for one printed board and insulation inspection for the other printed board at the same time.

7. The method according to claim 6, wherein the adapter board for conduction inspection is the inspection adapter board according to claim 1 or 2, and the adapter board for insulation inspection is the inspection adapter board according to claim 3 or 4.

8. A method for producing information for fabricating an inspection adapter board for printed board, which adapter board is equipped with inspection electrodes at positions corresponding to the positions of plural electrodes to be inspected on a printed board to be inspected, wherein at least one of the inspection electrodes is a common inspection electrode having a shape corresponding to a group of electrodes to be inspected, which is composed of at least two electrodes to be inspected, and the common inspection electrode is formed in a state that wiring networks formed independently from each other on the printed board to be inspected do not form an electrically closed circuit with each other through the common inspection electrode when the common inspection electrode is brought into contact with the printed board for the purpose of inspection, the method comprising producing information as to the common inspection electrode by executing:

(1) a grouping processing in which geometric information as to all the electrodes to be inspected on the printed board to be inspected and information as to electrical connection between the electrodes are utilized to form at least one group composed of plural electrodes to be inspected; and (2) a common electrode forming processing in which a virtual common electrode corresponding to a state that all the electrodes to be inspected belonging to one group of the electrodes to be inspected have been electrically connected to each other is formed.

9. An apparatus for producing information, which is an information processor used in fabricating an inspection adapter board for printed board, which adapter board is equipped with inspection electrodes at positions corresponding to the positions of plural electrodes to be inspected on a printed board to be inspected, wherein at least one of the inspection electrodes is a common inspection electrode having a shape corresponding to a group of electrodes to be inspected, which is composed of at least two electrodes to be inspected, and the common inspection electrode is formed in a state that wiring networks formed independently from each other on the printed board to be inspected do not form an electrically closed circuit with each other through the common inspection electrode when the common inspection electrode is brought into contact with the printed board for the purpose of inspection, the apparatus having:

(1) a grouping processing function by which geometric information as to all the electrodes to be inspected on the printed board to be inspected and information as to electrical connection between the electrodes are utilized to form at least one group composed of plural electrodes to be inspected; and (2) a processing function of forming a common electrode, by which a virtual common electrode corresponding to a state that all the electrodes to be inspected belonging to one group of the electrodes to be inspected have been electrically connected to each other is formed, wherein information as to the common inspection electrode is produced.

10. A method for producing information for fabricating an inspection adapter board for printed board, which adapter board is equipped with inspection electrodes, wherein at least one of the inspection electrodes is formed as a representative inspection electrode which is to be electrically connected to a representative electrode to be inspected composed of only one electrode to be inspected belonging to each of wiring networks formed independently from each other on the printed board to be inspected at a position corresponding to said representative electrode to be inspected, the method comprising producing information as to the representative inspection electrode and information as to a monitoring inspection electrode by executing:

(1) a processing for selecting a representative electrode to be inspected, in which only one electrode among plural electrodes to be inspected belonging to each of the wiring networks formed independently on the printed board to be inspected is selected as the representative electrode to be inspected; and (2) a processing for selecting a monitoring electrode to be inspected, in which at least one electrode to be inspected is selected as the monitoring electrode to be inspected from other electrodes to be inspected than the representative electrode to be inspected, which are electrically connected to the representative electrode to be inspected, among electrodes to be inspected formed on the printed board to be inspected.

11. An apparatus for producing information, which is an information processor used in fabricating an inspection adapter board for printed board, which adapter board is equipped with inspection electrodes, wherein at least one of the inspection electrodes is formed as a representative inspection electrode which is to be electrically connected to a representative electrode to be inspected composed of only one electrode to be inspected belonging to each of wiring networks formed independently from each other on the printed board to be inspected at a position corresponding to said representative electrode to be inspected, the apparatus having:

(1) a processing function of selecting a representative electrode to be inspected, by which only one electrode among plural electrodes to be inspected belonging to each of the wiring networks formed independently on the printed board to be inspected is selected as the representative electrode to be inspected; and (2) a processing function of selecting a monitoring electrode to be inspected, by which at least one electrode to be inspected is selected as the monitoring electrode to be inspected from other electrodes to be inspected than the representative electrode to be inspected, which are electrically connected to the representative electrode to be inspected, among electrodes to be inspected formed on the printed board to be inspected, wherein information as to the representative inspection electrode and information as to a monitoring inspection electrode are produced.

12. A method for producing information used in fabricating an inspection adapter board for printed board, the method comprising executing the grouping processing and common electrode forming processing according to claim 8, and executing the processing for selecting a representative electrode to be inspected and processing for selecting a monitoring electrode to be inspected according to claim 10.

13. An apparatus for producing information used in fabricating an inspection adapter board for printed board, the apparatus having the grouping processing function and processing function of forming a common electrode according to claim 9, and the processing function of selecting a representative electrode to be inspected and processing function of selecting a monitoring electrode to be inspected according to claim 11.

* * * * *